United States Patent [19]
Morrison

[11] Patent Number: 5,381,039
[45] Date of Patent: Jan. 10, 1995

[54] HERMETIC SEMICONDUCTOR DEVICE HAVING JUMPER LEADS

[75] Inventor: Paul-David Morrison, Round Rock, Tex.

[73] Assignee: Motorola, Inc., Schaumburg, Ill.

[21] Appl. No.: 239,169

[22] Filed: May 6, 1994

Related U.S. Application Data

[63] Continuation of Ser. No. 11,612, Feb. 1, 1993, abandoned.

[51] Int. Cl.$^6$ ............................................. H01L 39/02
[52] U.S. Cl. ................................ 257/701; 257/686; 257/700; 257/704; 257/778
[58] Field of Search ............... 257/668, 700, 701, 704, 257/784, 686, 778

[56] References Cited

U.S. PATENT DOCUMENTS

| | | | |
|---|---|---|---|
| 4,530,002 | 7/1985 | Kanai | 257/700 |
| 4,558,346 | 12/1985 | Kida et al. | 257/784 |
| 4,622,433 | 11/1986 | Frampton | 257/701 |
| 4,879,588 | 11/1989 | Ohtsuka et al. | 257/700 |
| 4,902,854 | 2/1990 | Kaufman | 174/52.4 |
| 4,985,753 | 1/1991 | Fujioka et al. | 257/704 |
| 4,987,477 | 1/1991 | Ikeno | 257/784 |
| 5,091,772 | 2/1992 | Kohara et al. | 357/74 |
| 5,103,291 | 4/1992 | Lian-Mueller | 357/74 |
| 5,111,277 | 5/1992 | Medeiros, III et al. | 357/74 |
| 5,134,246 | 7/1992 | Beppu et al. | 174/52.4 |
| 5,175,397 | 12/1992 | Lindberg | 257/668 |

FOREIGN PATENT DOCUMENTS

| | | | |
|---|---|---|---|
| 55-165661A | 12/1980 | Japan | H01L 23/48 |
| 58-92230A | 6/1983 | Japan | H01L 21/60 |

OTHER PUBLICATIONS

"Stackable J Leaded Chip Carrier," IBM Technical Disclosure Bulletin, vol. 28, No. 12, May 1986, pp. 5174-5175.

*Primary Examiner*—Robert P. Limanek
*Assistant Examiner*—David Ostrowski
*Attorney, Agent, or Firm*—Minh-Hien N. Clark

[57] ABSTRACT

A fine-pitch hermetic device (10) can be manufactured wherein two sets of wire bonds (18 & 20) are used to electrically connect a semiconductor die (12) to a leadframe (16). Jumper leads or conductive pads (28) are placed on an inner surface of a ceramic base (14) to electrically interconnect the two sets of wire bonds. The jumper leads enables shorter wire lengths to be used. The leadframe is attached to the ceramic base with glass embed technology. A cap (22) is affixed to the base with a hermetic seal (24). The invention is also compatible with flip-chip dice and multichip modules.

16 Claims, 2 Drawing Sheets

HERMETIC SEMICONDUCTOR DEVICE HAVING JUMPER LEADS

This application is a continuation of prior application Ser. No. 08/011,612, filed Feb. 1, 1993 now abandoned.

FIELD OF THE INVENTION

The field of the invention relates to semiconductor devices generally, and more specifically to a hermetic semiconductor device and a process for making the same.

BACKGROUND OF THE INVENTION

A ceramic quad package and a ceramic flat package, hereinafter referred to as a cerquad and cerflat, respectively, typically have a ceramic base, a leadframe attached to the ceramic base with a glass, a semiconductor die mounted on the ceramic base and wire bonded to leads of the leadframe, and a ceramic cap that is glass sealed to the base to form a hermetic semiconductor device. The leadframe is produced either by an etching process or a stamping process. The lead tips of a cerquad leadframe extend on all four sides toward a central die receiving area, typically a cavity in the ceramic base, while the lead tips of a cerflat leadframe only extend on two sides. Due to the limitations of etching technology, the lead tips cannot be extend indefinitely toward the center because the tip to tip lead pitch that can be achieved is currently limited. The minimum inner lead pitch of a cerquad leadframe is approximately 0.26 millimeter (10 mils) with a lead width of 0.13 millimeter (5 mils) and a spacing of 0.13 millimeter (5 mils). The leads cannot be manufactured any closer than what is currently achievable. Stamping technology cannot produce as fine pitch of a leadframe as etching technology. Hence, leadframe etching limitations dictates a minimum leadframe cavity size in a cerquad, which translates into an effective mininum die cavity size.

Developments in semiconductor technology are causing some problems in the packaging of semiconductor dice in cerquads. Many semiconductor dice have a high number of inputs/outputs (I/Os) while the overall size of the dice is shrinking. This development leads to a high pin count, fine-pitch cerquad device. As mentioned above, the minimum inner lead pitch of a cerquad leadframe is limited. Therefore, if a semiconductor die is much smaller in size than the minimum achievable die cavity in a cerquad, problems arise. The lengths of the wire bonds become prohibitively long which can lead to a shorting problem in the device. Wire bond lengths in a single-tier package, which are longer than approximately 100 times the diameter of the wire, can sag, sweep, and deform, all of which can lead to potential shorts. Increasing the semiconductor die size will decrease the wire bond lengths but is a costly solution because less dice can be placed on a single semiconductor wafer. Moreover, to unnecessarily increase die size is contrary to the direction in the semiconductor technology toward die size reduction.

One alternative to the fine-pitch problem of a cerquad leadframe is to use brazing technology, wherein the leads are brazed onto the base. The base would be metallized to maintain electrical continuity with the brazed leads. However, this is very costly technology as compared to the glass embed leadframe approach used in a cerquad, because brazed packages are normally gold plated internally as well as externally, while cerquad packages do not require external gold plating of the leads.

There is an additional push in the electronics industry toward increasing the density of devices on a board. Multiple chip modules are becoming more widely used. Because board space is limited, one way of increasing chip density on a board is to stack devices in the Z-direction. It would be desirable to be able to stack devices to form a module, such as a memory module, and still retain hermeticity for the devices.

A need exists for a cerquad that can house a small semiconductor die having a large number of I/Os without having prohibitively long wire lengths. A need also exists for a high density yet hermetic packaging method for high reliability applications.

SUMMARY OF THE INVENTION

The present invention provides, in one embodiment, a hermetic semiconductor device having jumper leads and a method for producing the same. The ceramic base having a plurality of conductive pads or jumper leads on a surface is provided. A leadframe having a plurality of conductors is attached to a periphery of the ceramic base with a glass material. A semiconductor die is bonded and directly electrically connected to the surface of the ceramic base. The plurality of conductors of the leadframe is wire bonded to the plurality of conductive pads of the ceramic base to electrically connect the semiconductor die to the leadframe. A cap is substantially aligned with the ceramic base, wherein the cap overlies the semiconductor die, and is then affixed to the ceramic base with a hermetic seal. The invention provides a hermetic structure produced by the above method.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
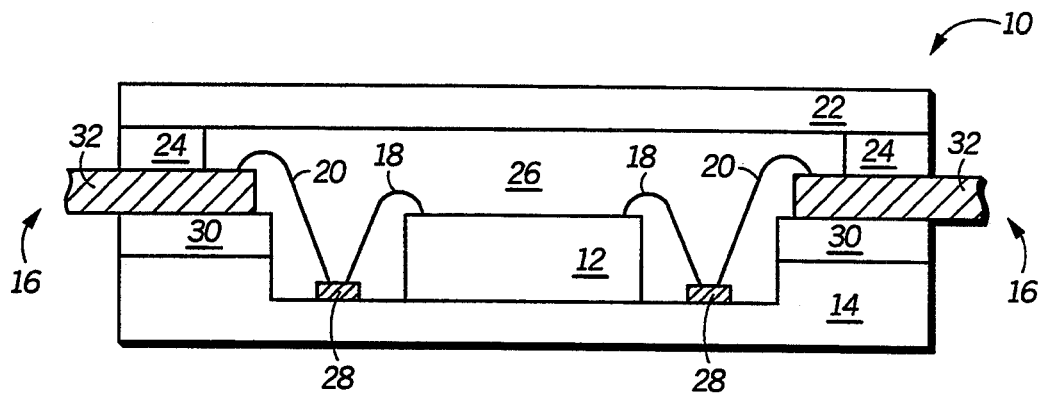
FIG. 1 illustrates, in cross-section, a hermetic semiconductor device having jumper leads, in a first embodiment of the present invention.

The invention is now discussed with reference to the figures. In FIG. 1, a cross-sectional view of a hermetic semiconductor device 10 is illustrated as a first embodiment of the present invention. Device 10 has a semiconductor die 12, a base 14, a leadframe 16, a plurality of wire bonds 18 & 20, a cap 22, and a seal 24. Device 10 is typically referred to as a cerquad in-the art. Base 14 and cap 22 are typically constructed from a ceramic material, although cap 22 can also be a metal, such as Kovar. Base 14 is illustrated to have a die cavity 26 for receiving semiconductor die 12. It should be noted that a base having a flat surface with no die cavity can also be used in practicing the invention. Base 14 has a plurality of conductive pads or jumper leads 28 on an inner surface of the base 14. These conductive pads or jumper leads 28 can also be embedded in the base 14. Conductive pads or jumper leads 28 can be screen printed onto the base 14. However, other methods employing metal deposition techniques can also be used to form the conductive pads or jumper leads 28 on the surface of the ceramic base 14. Conductive pads or jumper leads 28 can be plated with gold to enhance conductivity and to improve the surface for subsequent wire bonding. With current screen printing technology, the pitch for the conductive pads can be approximately 0.15 millimeter (6 mils), with a pad width of approximately 0.10 millimeter (4 mils) and a spacing of approximately 0.05 millimeter (2 mils). Both the width of a conductive pad and the spacing between pads are smaller than what can be achieved with a current etched cerquad leadframe. An aluminum sputtering technique can achieve an even finer pitch for the conductive pads, with a 0.05 millimeter (2 mils) width and a 0.025 millimeter (1 mil) spacing. However, aluminum sputtering is a very expensive option compared to screen printing and would probably only be considered for application specific devices requiring very high pin counts in a hermetic package.

Also illustrated in FIG. I is a cerquad leadframe 16 which is attached to a periphery of the ceramic base 14 with a glass material 30. Leadframe 16 has a plurality of conductors or leads 32 that extend toward the semiconductor die 12. As mentioned previously, the minimum lead pitch achievable with current leadframe etching technology determines the minimum size of a leadframe cavity, which translates into an effective minimum die cavity 26. Die cavity 26 cannot be made effectively smaller if the conductors 32 cannot extend further inward. In other words, semiconductor die 12 cannot be any closer to the edge of the conductors 32 if the conductors cannot extend further inward regardless of the actual size of the die cavity 26.

As illustrated in FIG. 1, semiconductor die 12 is mounted onto a inner surface of the base 14. Bonding of the die 12 to the ceramic base 14 can be accomplished by using eutectic alloys (gold-silicon), epoxies, or polyimides filled with precious metals or silver filled glasses. After attaching the die 12 to the base 14, a first set of wire bonds 18 are made to electrically connect the semiconductor die 12 to the plurality of conductive pads 28 on the surface of the ceramic base 14. Methods of wire bonding are known in the art. For example, an ultrasonic wire bonding technique can be used to wire bond aluminum or aluminum alloy wires. The length of the wire bonds 18 can be kept below 100 times the diameter of the wire to ensure that the wires do not sag or deform. A typical wire diameter that would be used in fine-pitch packages is 0.025 millimeter (1 mil). In that instance, the length of the wire bonds should be kept below 2.5 millimeters (100 mils). A second set of wire bonds 20 are made between the plurality of conductors 32 and the plurality of conductive pads 28 to establish electrical contact between the semiconductor die 12 and the leadframe 16. In effect, two sets of wire bonds are used to electrically connect the die to the leadframe instead of a single set of wire bonds which would lead to prohibitively long wire lengths. Moreover, a lower profile for the device 10 is also achieved because the wire bond loop heights for both wire bonds 18 & 20 are lower than what would have been possible with a single set of wire bonds to electrically connect the die to the leadframe.

Further illustrated in FIG. 1 is a cap 22 that overlies the semiconductor die 12. Cap 22 can be either a ceramic material, such as alumina, or a metal, such as Kovar. Cap 22 is substantially aligned with the base 14 and is sealed to the base with a seal 24. Seal 24 provides a hermetic seal between the cap 22 and the ceramic base 14. Seal 24 is typically a glass seal, but a solder seal may also be used. Typically, a glass seal is used in conjunction with a ceramic cap, while a solder seal is used in conjunction with a metal cap. In the case of a glass seal, the glass material for the seal 24 is typically screen printed or otherwise deposited onto the cap 22 at a manufacturer of the cap. The cap 22 is positioned over the semiconductor die 12 so that the cap 22 substantially aligns with the base 14. The glass material adhering to the periphery of the cap 22 is then reflowed so that the melted glass flows to wet to the periphery of the ceramic base 14 The melted or reflowed glass material adhesively couples the cap 22 to the base 14, thus forming a hermetic seal 24 for the semiconductor device 10. Typical reflowing temperature for a glass seal material is 450° C., although lower or higher temperatures may also be used depending on the material. Some glass seal materials can be reflowed at 350° C. while others may require a higher reflowing temperature of approximately 500° C. Developments are also ongoing for lower reflowing temperatures in glass seals. Lower processing temperatures are more desirable from an assembly point of view and may be less likely to detrimentally affect the semiconductor die. In the case of a metal cap, the solder seal is pre-tacked onto the periphery of the cap. Reflowing the solder would then seal the cap to the base. An advantage to using a metal cap is that metal caps are typically thinner than ceramic caps; therefore, a lower profile package can be achieved using a metal cap. Another advantage to using a metal cap with a solder seal is that it allows a lower typical processing temperature (approximately 350° C.) which is more compatible with flip-chip bonding. As mentioned above, leadframe 16 is attached to the periphery of the ceramic base 14 with a glass material 30, which maintains the integrity of the hermetic seal for the device.

The external lead configuration of semiconductor device 10 is not specifically illustrated in FIG. 1 because it can be formed into any desired configuration. A typical lead configuration for a cerquad is a gull wing shape, although other lead configurations, such as J-leaded and through-hole leads, are also possible.

Subsequent embodiments of the invention utilize many of the same elements that have the same or substantially similar functions, and will thus be labeled the same as in FIG. 1 in the following figures.

Figure 2:
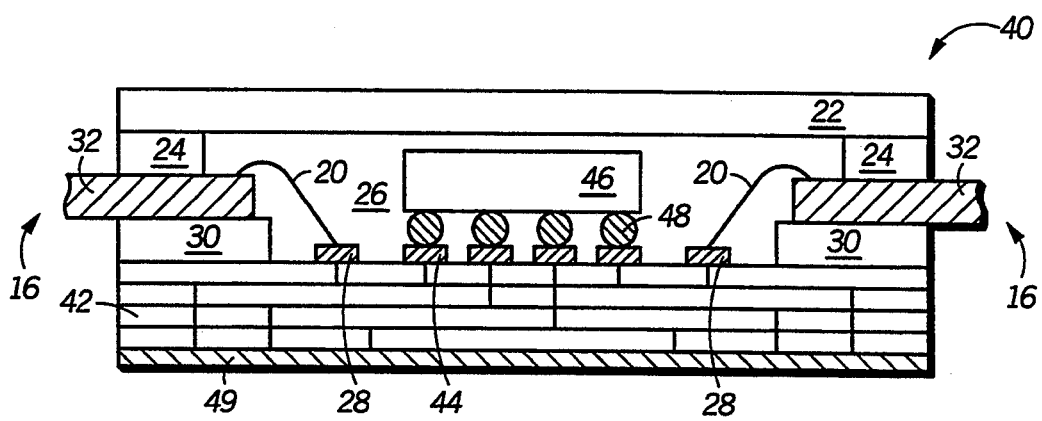
FIG. 2 illustrates, in cross-section, a hermetic semiconductor device that is compatible with a flip-chip die, in a second embodiment of the present invention.

FIG. 2 illustrates, in cross-section, a hermetic semiconductor device 40 in a second embodiment of the present invention. Device 40 combines a flip-chip attachment method with a cerquad design to provide hermetic packaging for semiconductor dice having array bonding pads. In this second embodiment, a multilayer ceramic base 42 is utilized. Multilayer technology is well known in the art and can be employed to produce the base 42. Multilayer ceramic base 42 has a first array of conductive pads 44 on an inner surface. This first array of conductive pads 44 is used to form physical and electrical connections with semiconductor die 46. As illustrated, semiconductor die is flip-chip bonded to the inner surface of the multilayer ceramic base 42 with a plurality of conductive interconnect bumps 48. The conductive interconnect bumps 48 are typically formed from solder although other conductive metal alloys may also be possible. The plurality of conductive interconnect bumps 48 electrically connect the semiconductor die 46 to multilayer ceramic base 42.

Further illustrated in FIG. 2 is a second array of conductive pads 28 on the inner surface of the multilayer ceramic base 42. This second array of conductive pads 28 is electrically interconnected to the first array of conductive pads 44. The actual path of interconnection between the first and second arrays will vary dependent on the specific type of semiconductor die that is bonded to the multilayer ceramic base. As illustrated in FIG. 2, the second array of conductive pads 28 forms a peripheral array around the first array of conductive pads 44, because the first array 44 is designed to accommodate a semiconductor die with area array bonding pads while the second array 28 is designed to match a cerquad leadframe with peripheral leads. A plurality of wire bonds 20 are formed between the plurality of conductors 32 of the leadframe 16 and the second array of conductive pads 28 to establish electrical connections between the multilayer base 42 and the leadframe 16. In this manner, the semiconductor die 46 is electrically connected to the leadframe 16 because the first and second arrays of conductive pads are electrically interconnected. Methods of wire bonding are well known in the art.

As previously mentioned, multilayer ceramic base 42 is produced using multilayer fabrication technology. Since the idea of multilayer is to have multiple layers of metallization, it is possible to have metallization on both the inner and outer surfaces of the multilayer base. For ease of illustration, the conductive pads 49 on the outer surface of the multilayer ceramic base 42 is illustrated as a continuous layer of metallization. However, it should be noted that each conductive pad on the outer surface of the multilayer base is electrically isolated from one another. Moreover, the conductive pads 49 may have one array of pads in a central portion of the outer surface and another array around the periphery of the center array, much the same as the two arrays of conductive pads on the inner surface of the base 42. Although outside metallization is not required on the multilayer base 42 to practice this second embodiment of the invention, other embodiments need these outside conductive pads. The usefulness of the conductive pads 49 will become more apparent in a later discussion of stacked modules.

In a same method as that discussed for FIG. 1, additionally illustrated in FIG. 2 is cap 22 that overlies the semiconductor die 46. Again, cap 22 can be either ceramic or metal and is substantially aligned with the multilayer base 42 and is sealed to the base 42 with seal 24. Seal 24 provides a hermetic seal between the cap 22 and the multilayer ceramic base 42 and can be glass or solder. Furthermore, leadframe 16 is attached to the periphery of the multilayer ceramic base 42 with a glass material 30, which maintains the integrity of the hermetic seal for the device. Additionally, the external lead configuration of semiconductor device 40 can be formed into any desired configuration, such as gull-wing-leaded, J-leaded and through-hole leaded.

Figure 3:
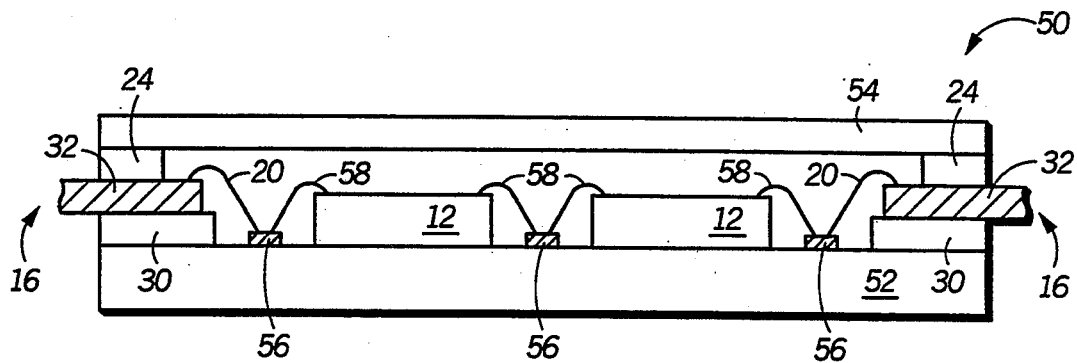
FIG. 3 illustrates, in cross-section, a hermetic semiconductor device having multiple dice, in a third embodiment of the present invention.

FIG. 3 illustrates, in cross-section, a hermetic multichip module 50 in accordance with a third embodiment of the present invention. Module 50 is composed of a ceramic base 52, a plurality of semiconductor dice 12, a leadframe 16, and a cap 54. Ceramic base 52 has a plurality of conductive pads or jumper leads 56 on an inner surface. Ceramic base 52 may or may not require multilayer technology to produce, depending on the complexity of the routing of the conductive pads 56. The semiconductor dice 12 are bonded to the inner surface of the ceramic base 52. Methods of bonding are the same as that discussed above for FIG. 1. Although only two semiconductor dice 12 are illustrated, it is obvious that any number of semiconductor dice may be used depending on the application of the module 50. After being bonded to the ceramic base 52, the semiconductor dice 12 are wire bonded to the plurality of the conductive pads 56. The plurality of wire bonds 58 electrically connect the semiconductor dice 12 to the ceramic base 52. In additional, the wire bonds 58 electrically interconnect the semiconductor dice 12, which is applicable to many memories applications. As an alternative, semiconductor dice being flip-chip bonded to the base may be used in combination with or instead of wire bonded semiconductor dice. Once the semiconductor dice 12 are wire bonded to the base 52, a second set of wire bonds 20 is made between the conductors 32 of the leadframe to peripheral pads of conductive pads 56 to electrically connect the semiconductor dice 12 to the leadframe 16. The cap 54 is then aligned to the ceramic base 52 and affixed thereto with seal 24 to hermetically seal the module 50.

Figure 4:
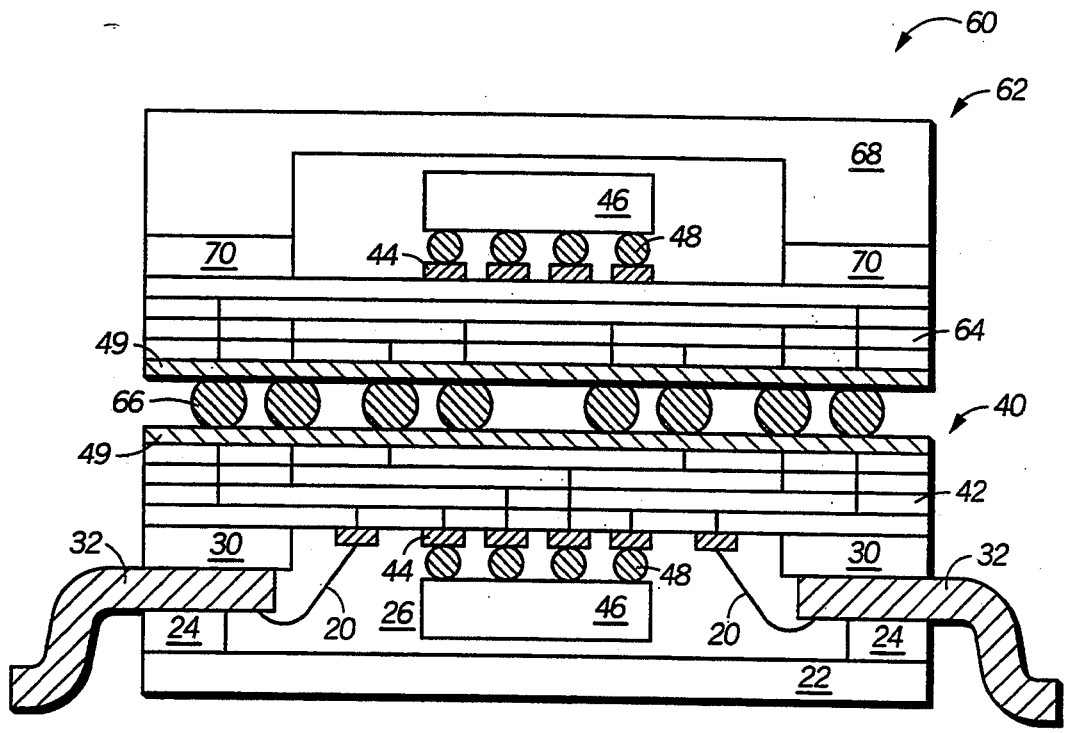
FIG. 4 illustrates, in cross-section, a stacked hermetic semiconductor device using solder balls, in a fourth embodiment of the present invention.

FIG. 4 illustrates, in cross-section, a stacked hermetic semiconductor module 60 in accordance with a fourth embodiment of the present invention. Stacked module 60 is composed of two hermetic semiconductor devices. The bottom semiconductor device is substantially the same as device 40 previously discussed in FIG. 2. However, the device 40 has been inverted so that a second semiconductor device may be stacked to an outer surface of the multilayer ceramic base 42. The external portion of the leadframe 16 has been formed so that device 40 would be mounted upside down to a board, which does not affect the functionality of the device.

In FIG. 4, a second hermetic semiconductor device 62 is shown to be stacked above device 40. Device 62 is similar to device 40 with some key differences. Device 62 has a multilayer base 64 which has an array of conductive pads 44 designed to accommodate a semiconductor die with area array bonding pads for flip-chip bonding. Multilayer base 64 does not require a second array of peripheral conductive pads, because device 62 does not have a leadframe to which the semiconductor die must be electrically connected. However, it is possible to use a multilayer base that has a peripheral array of conductive pads like base 42 in place of base 64. The peripheral array of conductive pads would simply be redundant and not used. As illustrated in FIG. 4, device 62 is stacked above device 40, wherein the multilayer ceramic base 64 is coupled to the base 42 of device 40 with a plurality of solder balls 66. The solder balls 66 connect respective ones of conductive pads 49 from the two bases 42 & 64 together to electrically interconnect the two devices. It should be noted that device 62 is also a hermetic device. Cap 68 in this embodiment, has a cavity to accommodate the semiconductor die 46. Depending on the height of the die 46 and the thickness of glass seal 70, this cavity may or may not be required. By individually sealing each semiconductor die in a hermetic package and then stacking the devices to form a module, it is possible to increase the density of devices in a given area by expanding in the Z-direction, yet still retain the high reliability associated with hermetic packaging.

Figure 5:
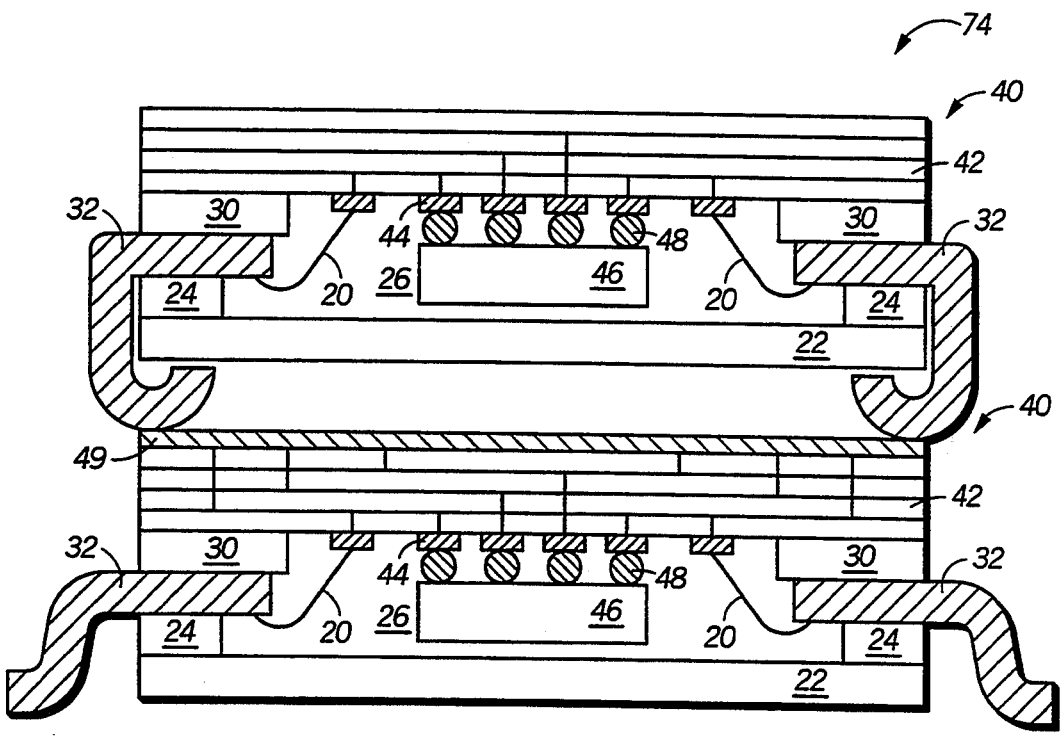
FIG. 5 illustrates, in cross-section, a stacked hermetic semiconductor device using external leads, in a fifth embodiment of the present invention.

Illustrated in FIG. 5, in a cross-sectional view, is another stacked hermetic semiconductor module 74, in accordance with a fifth embodiment of the present invention. Module 74 is illustrated as being a stacking of two inverted semiconductor devices 40 of FIG. 2. The external portion of the leadframe 16 of the upper device in the stacked module 74 is formed into a J-leaded configuration. This J-leaded device 40 is then stacked above the lower device 40 and is soldered to the conductive pads 49 on the outer surface of the ceramic base 42 of the lower device. After soldering the external leads of the upper device to the conductive pads 49 of the lower device, the two devices become electrically interconnected.

In this fifth embodiment, both top and bottom devices are inverted in the stack. In this manner, another device may be stacked above the upper device. This configuration of stacking allows for a stacking of a multiplicity of devices, with only several limitations. One limitation is the height of the stacked module may be restricted by the application in which the stacked module is to be used. Another limitation may be the heat dissipation from the stack. This type of stacked module is well suited for low power applications where heat dissipation is not anticipated to be a problem.

The foregoing description and illustrations contained herein demonstrate many of the advantages associated with the present invention. In particular, it has been revealed that a low profile, fine pitch, hermetic semiconductor device can be manufactured. The manufacturing of such a device utilizes jumper leads to reduce wire bond lengths of the semiconductor device. Furthermore, the invention allows a combination of glass seal technology with the flexibility of multilayer technology to achieve a solution to a fine-pitch package without the high cost of brazing technology. Another advantage is that the present invention enables a semiconductor die having area array bonding pads to be packaged hermetically and with a low cost technology. Moreover, the invention is applicable to multichip module applications, both in a single packaged module or in a vertical stack of discrete devices. Additionally, the invention is well suited to memory modules as well as applications requiring high device reliability.

Thus it is apparent that there has been provided, in accordance with the invention, a hermetic semiconductor device having jumper leads in the ceramic base that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the base and cap may be of a number of different ceramic or metal materials. Seals other than glass may also be possible as long as the sealing material provides a hermetic seal for the semiconductor device. Moreover, epoxy seals may also be used if hermeticity is not an issue. In addition, the invention is not limited to any specific external lead configuration of a semiconductor device. The device may have gull-wing leaded, J-leaded or any other lead configuration. Furthermore, the device may either be a cerquad or a cerflat. Additionally, in a stacking module, the devices do not need to be of a same size or of a same pin count. The bottom device in the stack, however, does need to be large enough to support the upper devices. It is also important to note that the present invention is not limited in any way to any specific type of semiconductor devices. Memory devices are well suited for the multichip embodiments of the invention, but other devices that can be stacked into a module may also be housed in an embodiment of the invention. Therefore, it is intended that this invention encompass all such variations and modifications as fall within the scope of the appended claims.

I claim:

1. A hermetic semiconductor device comprising:
   a ceramic base having a first array of conductive pads on a surface and a second array of conductive pads around a periphery of the first array, wherein the first and second arrays of conductive pads are electrically interconnected by means for routing in the ceramic base;
   a leadframe having a plurality of conductors in a quadrilateral configuration, wherein the plurality of conductors is attached to a periphery of the ceramic base with a glass material, the plurality of conductors having a surface mountable external portion that is curved;
   a semiconductor die electrically connected to the first array of conductive pads by way of flip-chip bonding with a plurality of conductive interconnect bumps;
   a plurality of wire bonds connecting the plurality of conductors to the second array of conductive pads to electrically connect the semiconductor die to the leadframe;
   a cap overlying the semiconductor die and substantially aligning with the ceramic base; and
   a seal which adhesively couples the ceramic base to the cap to provide a hermetic seal around the semiconductor die.

2. The device of claim 1, wherein the ceramic base further comprises a third array of conductive pads on a second surface of the ceramic base, the third array of conductive pads being electrically connected to the first and second arrays of conductive pads.

3. The device of claim 2 further comprising:
   a second ceramic base having a fourth array of conductive pads on a first surface of the second ceramic base and a fifth array of conductive pads on a second surface, wherein the fourth and fifth arrays of conductive pads are electrically interconnected by means for routing in the second ceramic base;
   a second semiconductor die electrically connected to the fourth array of conductive pads by way of flip-chip bonding with a second plurality of conductive interconnect bumps;
   a second cap overlying the second semiconductor die and substantially aligning with the second ceramic base;
   a second seal which adhesively couples the second ceramic base to the second cap to provide a hermetic seal around the second semiconductor die; and a plurality of solder balls coupling the third array of conductive pads on the second surface of the first ceramic base to the fifth array of conductive pads on the second surface of the second ceramic base, wherein a stacked hermetic semiconductor device is formed.

4. The device of claim 3, wherein the first and second ceramic bases have a cavity for receiving the semiconductor die.

5. The device of claim 3, wherein the first and second seal comprise a material selected from a group consisting of: glass and solder.

6. The device of claim 3, wherein the first and second cap comprise a material selected from a group consisting of: ceramic, metal, and alumina.

7. The device of claim 2 further comprising:
a second ceramic base having a fourth array of conductive pads on a first surface of the second ceramic base and a fifth array of conductive pads around a periphery of the fourth array, wherein the fourth and fifth arrays of conductive pads are electrically interconnected by means for routing in the second ceramic base;
a second semiconductor die electrically connected to the fourth array of conductive pads by way of flip-chip bonding with a second plurality of conductive interconnect bumps;
a second leadframe having a second plurality of conductors, wherein the second plurality of conductors is attached to a periphery of the second ceramic base with a glass material, the second plurality of conductors having a surface mountable external portion that is curved;
a second plurality of wire bonds connecting the second plurality of conductors to the fifth array of conductive pads to electrically connect the second semiconductor die to the second leadframe;
a second cap overlying the second semiconductor die and substantially aligning with the second ceramic base; and
a second seal which adhesively couples the second multilayer ceramic base to the second cap to provide a hermetic seal around the second semiconductor die;
wherein the external portion of the second plurality of conductors is physically and electrically connected to the third array of conductive pads to form a stacked hermetic semiconductor device.

8. The device of claim 7, wherein the first and second seal comprise a material selected from a group consisting of: glass and solder.

9. The device of claim 7, wherein the first and second cap comprise a material selected from a group consisting of: ceramic, metal, and alumina.

10. A hermetic semiconductor device comprising:
a multilayer ceramic base having a first array of conductive pads on a surface and a second array of conductive pads around a periphery of the first array, wherein the first and second arrays of conductive pads are electrically interconnected by means for routing in the multilayer ceramic base;
a leadframe having a plurality of conductors in a quadrilateral configuration, wherein an inner portion of the plurality of conductors is attached to a periphery of the multilayer ceramic base with a glass material and an outer portion of the plurality of conductors is shaped to a surface mountable configuration;
a semiconductor die electrically connected to the first array of conductive pads by way of flip-chip bonding with a plurality of conductive interconnect bumps;
a plurality of wire bonds connecting the plurality of conductors to the second array of conductive pads to electrically connect the semiconductor die to the leadframe;
a cap overlying the semiconductor die and substantially aligning with the multilayer ceramic base; and
a glass seal which adhesively couples the multilayer ceramic base to the cap to provide a hermetic seal around the semiconductor die.

11. The device of claim 10, wherein the multilayer ceramic base further comprises a third array of conductive pads on a second surface of the multilayer ceramic base, the third array of conductive pads being electrically connected to the first and second arrays of conductive pads.

12. The device of claim 11 further comprising:
a second multilayer ceramic base having a fourth array of conductive pads on a first surface of the second multilayer ceramic base and a fifth array of conductive pads on a second surface, wherein the fourth and fifth arrays of conductive pads are electrically interconnected;
a second semiconductor die electrically connected to the fourth array of conductive pads by way of flip-chip bonding with a second plurality of conductive interconnect bumps;
a second cap overlying the second semiconductor die and substantially aligning with the second multilayer ceramic base;
a second seal which adhesively couples the second multilayer ceramic base to the second cap to provide a hermetic seal around the second semiconductor die; and
a plurality of solder balls coupling the third array of conductive pads on the second surface of the first multilayer ceramic base to the fifth array of conductive pads on the second surface of the second multilayer ceramic base, wherein a stacked hermetic semiconductor device is formed.

13. The device of claim 12, wherein the first and second multilayer ceramic bases have a cavity for receiving the semiconductor die.

14. The device of claim 12, wherein the first and second cap comprise a material selected from a group consisting of: ceramic, metal, and alumina.

15. The device of claim 11 further comprising:
a second multilayer ceramic base having a fourth array of conductive pads on a first surface of the second multilayer ceramic base and a fifth array of conductive pads around a periphery of the fourth array, wherein the fourth and fifth arrays of conductive pads are electrically interconnected by means for routing in the second multilayer ceramic base;
a second semiconductor die electrically connected to the fourth array of conductive pads by way of flip-chip bonding with a second plurality of conductive interconnect bumps;
a second leadframe having a second plurality of conductors, wherein an inner portion of the second plurality of conductors is attached to a periphery of the second multilayer ceramic base with a glass material, the second plurality of conductors having a surface mountable external portion that is curved;

a second plurality of wire bonds connecting the second plurality of conductors to the fifth array of conductive pads to electrically connect the second semiconductor die to the second leadframe;

a second cap overlying the second semiconductor die and substantially aligning with the second multilayer ceramic base; and a second seal which adhesively couples the second multilayer ceramic base to the second cap to provide a hermetic seal around the second semiconductor die;

wherein the external portion of the second plurality of conductors is physically and electrically connected to the third array of conductive pads to form a stacked hermetic semiconductor device.

16. The device of claim 15, wherein the first and second cap comprise a material selected from a group consisting of: ceramic, metal, and alumina.

* * * * *